United States Patent
Ootsuka

(10) Patent No.: US 10,868,052 B2
(45) Date of Patent: Dec. 15, 2020

(54) IMAGING ELEMENT, MANUFACTURING METHOD, AND ELECTRONIC APPARATUS

(71) Applicant: SONY SEMICONDUCTOR SOLUTIONS CORPORATION, Kanagawa (JP)

(72) Inventor: Yoichi Ootsuka, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/475,763

(22) PCT Filed: Dec. 28, 2017

(86) PCT No.: PCT/JP2017/047264
§ 371 (c)(1),
(2) Date: Jul. 3, 2019

(87) PCT Pub. No.: WO2018/131509
PCT Pub. Date: Jul. 19, 2018

(65) Prior Publication Data
US 2019/0348452 A1 Nov. 14, 2019

(30) Foreign Application Priority Data
Jan. 13, 2017 (JP) .................... 2017-004580

(51) Int. Cl.
*H01L 27/146* (2006.01)
*B60R 11/04* (2006.01)
(Continued)

(52) U.S. Cl.
CPC ........ *H01L 27/14605* (2013.01); *B60R 11/04* (2013.01); *G02B 3/0006* (2013.01);
(Continued)

(58) Field of Classification Search
CPC ............ G02B 5/1842; H01L 27/14605; H01L 27/14627; H01L 27/14645
See application file for complete search history.

(56) References Cited

U.S. PATENT DOCUMENTS

2002/0135825 A1* 9/2002 Lee ................. G02B 5/1814
358/509
2007/0298533 A1* 12/2007 Yang ................ G02B 27/1013
438/57
(Continued)

FOREIGN PATENT DOCUMENTS

| JP | 2006-259569 | * 3/2005 |
| JP | 2008-287747 | 11/2008 |

(Continued)

OTHER PUBLICATIONS

International Search Report prepared by the Japan Patent Office dated Mar. 26, 2018, for International Application No. PCT/JP2017/047264.

*Primary Examiner* — Ahmed N Sefer
(74) *Attorney, Agent, or Firm* — Sheridan Ross P.C.

(57) ABSTRACT

The present disclosure relates to an imaging element, a manufacturing method, and an electronic apparatus which enable an image having higher image quality to be captured. In a valid pixel region in which a plurality of pixels is arranged in a matrix, a plurality of microlenses for condensing light is formed in a corresponding relation with the pixels, and in a valid pixel peripheral region which is provided so as to surround an outside of the valid pixel region, a plurality of slit type light diffraction gratings is formed such that a longitudinal direction thereof extends in a direction orthogonal to a side direction of the valid pixel region. Then, an anti-reflection film is deposited on the (Continued)

microlenses and the slit type light diffraction gratings. The present technology, for example, can be applied to a CMOS image sensor.

18 Claims, 14 Drawing Sheets

(51) Int. Cl.
    *G02B 5/18*     (2006.01)
    *H04N 5/374*     (2011.01)
    *G02B 3/00*     (2006.01)
    *G02B 27/00*     (2006.01)

(52) U.S. Cl.
    CPC ......... *G02B 5/1842* (2013.01); *G02B 5/1857* (2013.01); *G02B 27/0018* (2013.01); *H01L 27/146* (2013.01); *H01L 27/14607* (2013.01); *H01L 27/14621* (2013.01); *H01L 27/14623* (2013.01); *H01L 27/14625* (2013.01); *H01L 27/14627* (2013.01); *H01L 27/14645* (2013.01); *H01L 27/14685* (2013.01); *H04N 5/374* (2013.01)

(56) References Cited

U.S. PATENT DOCUMENTS

| | | | |
|---|---|---|---|
| 2010/0201834 | A1 | 8/2010 | Watanabe et al. |
| 2012/0224263 | A1 | 9/2012 | Gallagher |
| 2013/0032914 | A1* | 2/2013 | Iwasaki ............. H01L 27/14621 257/432 |
| 2013/0270665 | A1 | 10/2013 | Sasaki |
| 2015/0085168 | A1 | 3/2015 | Watanabe et al. |
| 2016/0079300 | A1 | 3/2016 | Watanabe et al. |
| 2017/0309674 | A1 | 10/2017 | Watanabe et al. |

FOREIGN PATENT DOCUMENTS

| | | |
|---|---|---|
| JP | 2008-304855 | 12/2008 |
| JP | 2010-186818 | 8/2010 |
| JP | 2010-212635 | 9/2010 |
| JP | 2011-146481 | 7/2011 |
| JP | 2013-012518 | 1/2013 |
| JP | 2014-207253 | 10/2014 |

* cited by examiner

IMAGING ELEMENT, MANUFACTURING METHOD, AND ELECTRONIC APPARATUS

CROSS REFERENCE TO RELATED APPLICATIONS

This application is a national stage application under 35 U.S.C. 371 and claims the benefit of PCT Application No. PCT/JP2017/047264 having an international filing date of 28 Dec. 2017, which designated the United States, which PCT application claimed the benefit of Japanese Patent Application No. 2017-004580 filed 13 Jan. 2017, the entire disclosures of each of which are incorporated herein by reference.

TECHNICAL FIELD

The present disclosure relates to an imaging element, a manufacturing method, and an electronic apparatus, and more particularly to an imaging element, a manufacturing method, and an electronic apparatus which enable an image having higher image quality to be captured.

In recent years, a solid-state imaging device is used in various image inputting apparatuses such as a video camera, a digital still camera, and a facsimile. The solid-state imaging device has a pixel region in which a plurality of pixels for generating signal electric charges in accordance with a quantity of incident light is arranged in a matrix, and outputs signal electric charges generated in the respective pixels as image signals to the outside.

Incidentally, in the past solid-state imaging device, the light which is made incident to a valid pixel peripheral region provided so as to surround an outside of a valid pixel region in which pixels composing an image are arranged is reflected to turn into stray light, so that a flare, a ghost or the like is generated in the image in some cases.

Accordingly, in order to suppress the generation of a flare, a ghost or the like due to stray light, for example, PTL 1 proposes a solid-state imaging element having a configuration in which a convex body similar to an on-chip lens in the valid pixel region is provided on a surface of the valid pixel peripheral region.

CITATION LIST

Patent Literature

[PL1]
Japanese Patent Laid-Open No. 2013-12518

SUMMARY

Technical Problem

Incidentally, as described above, in the past as well, the measures to suppress the generation of a flare, a ghost or the like due to the stray light have been taken. However, the suppression effect is not sufficient, and the measures to obtain a higher suppression effect are desired. It is thus expected that a bad influence due to a flare, a ghost or the like is excluded and an image having higher image quality is captured.

The present disclosure has been made in the light of such a situation, and enables an image having higher image quality to be captured.

Solution to Problem

An imaging element according to an aspect of the present disclosure includes: a valid pixel region in which a plurality of pixels is arranged in a matrix and a plurality of microlenses for condensing light is formed in a corresponding relation with the pixels; and a valid pixel peripheral region which is provided so as to surround an outside of the valid pixel region, and in which a plurality of slit type light diffraction gratings is formed such that a longitudinal direction thereof extends in a direction orthogonal to a side direction of the valid pixel region.

A manufacturing method according to an aspect of the present disclosure includes the steps of: forming a plurality of microlenses for condensing light, in a valid pixel region in which a plurality of pixels is arranged in a matrix, in a corresponding relation with the pixels; and forming a plurality of slit type light diffraction gratings in a valid pixel peripheral region provided so as to surround an outside of the valid pixel region such that a longitudinal direction thereof extends in a direction orthogonal to a side direction of the valid pixel region.

An electronic apparatus according to an aspect of the present disclosure includes an imaging element. The imaging element includes: a valid pixel region in which a plurality of pixels is arranged in a matrix and a plurality of microlenses for condensing light is formed in a corresponding relation with the pixels; and a valid pixel peripheral region which is provided so as to surround an outside of the valid pixel region, and in which a plurality of slit type light diffraction gratings is formed such that a longitudinal direction thereof extends in a direction orthogonal to a side direction of the valid pixel region.

In one aspect of the present disclosure, a plurality of microlenses for condensing light is formed, in a valid pixel region in which a plurality of pixels is arranged in a matrix, in a corresponding relation with the pixels; and a plurality of slit type light diffraction gratings is formed in a valid pixel peripheral region provided so as to surround an outside of the valid pixel region such that a longitudinal direction thereof extends in a direction orthogonal to a side direction of the valid pixel region.

Advantageous Effect of Invention

According to one aspect of the present disclosure, an image having higher image quality can be captured.

DESCRIPTION OF EMBODIMENTS

Hereinafter, specific embodiments to which the present technology is applied will be described in detail with reference to the drawings.

<First Configuration Example of Imaging Element>

Figure 1:
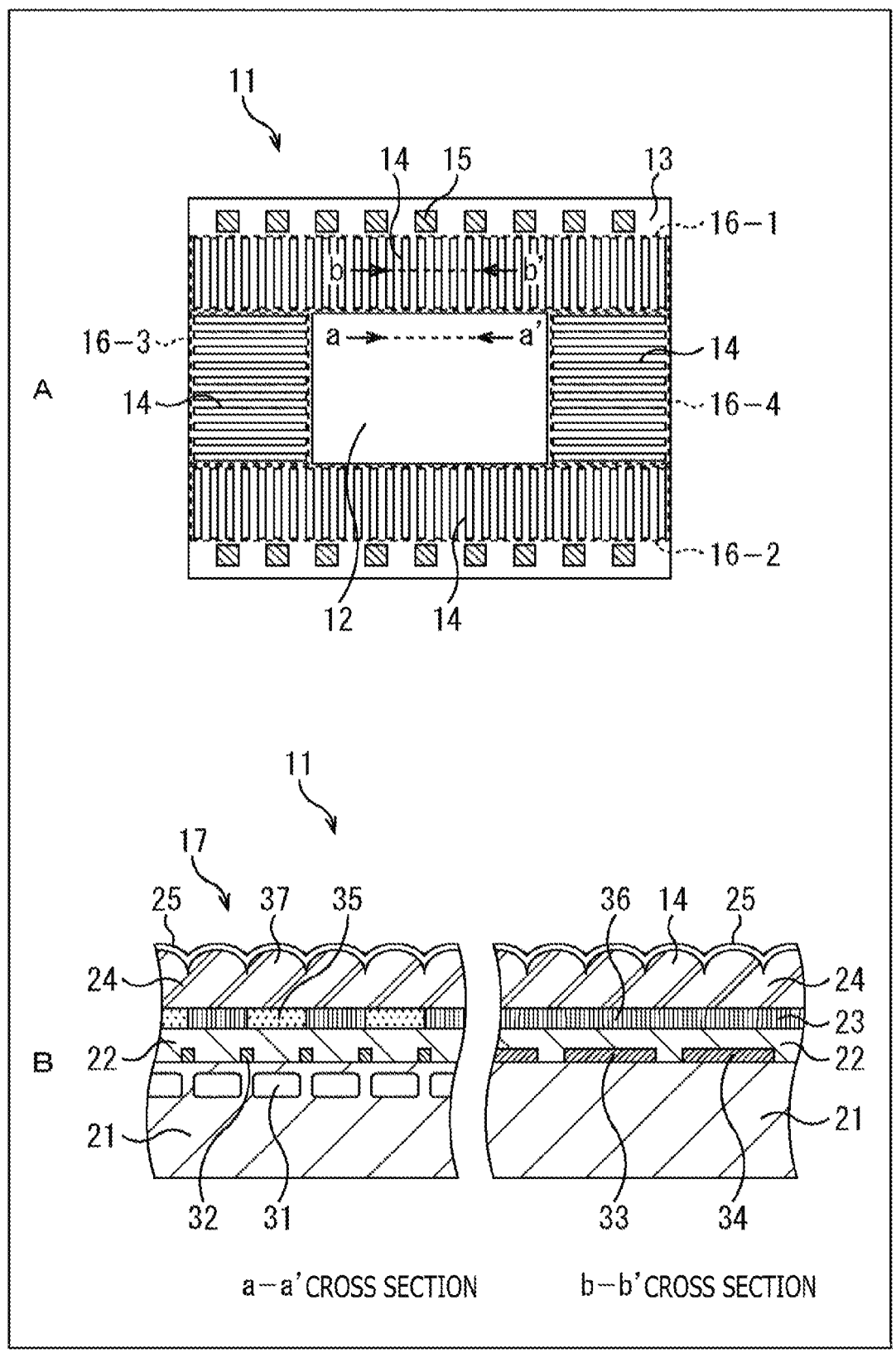
FIG. 1 is a view depicting a configuration example of a first embodiment of an imaging element to which the present technology is applied.

FIG. 1 is a view depicting a configuration example of a first embodiment of an imaging element to which the present technology is applied. A of FIG. 1 depicts a schematic configuration when an imaging element 11 is planarly viewed. B of FIG. 1 depicts a cross section taken along line a-a' and a cross section taken along line b-b' in the imaging element 11 depicted in A of FIG. 1.

As depicted in A of FIG. 1, the imaging element 11 is a CMOS (Complementary Metal Oxide Semiconductor) image sensor, and includes a plurality of slit type light diffraction gratings 14 which is formed in a valid pixel peripheral region 13 provided in an outer periphery of a valid pixel region 12 provided substantially at a center.

The valid pixel region 12 is a region in which a plurality of pixels 17 (refer to B of FIG. 1) is arranged in a matrix. The valid pixel region 12 receives light, in which an image of a subject is formed by an optical system (not depicted), for each pixel 17, and outputs pixel signals for generating an image obtained by imaging the subject.

The valid pixel peripheral region 13 is a region provided in a circumference of the valid pixel region 12, and is a region in which a peripheral circuit for driving the pixels 17 provided in the valid pixel region 12, various kinds of wirings, and the like are formed. In addition, as depicted in the figure, a plurality of bonding pads 15 is formed along each of two sides (in the example of A of FIG. 1, an upper side and a lower side) in the valid pixel peripheral region 13. The bonding pads 15 are each an electrode through which the imaging element 11 is electrically connected to the outside and, for example, a bonding wire is bonded to the bonding pad 15.

The slit type light diffraction gratings 14 are each formed such that a longitudinal direction thereof extends from one of four sides of the valid pixel region 12 toward the outside in a direction orthogonal to the side direction and a cross-sectional shape when viewed along the longitudinal direction is substantially a semicircular convex shape (refer to a cross section taken along line b-b' of B of FIG. 1). The slit type light diffraction gratings 14 are formed in this manner, whereby a surface shape of the valid pixel peripheral region 13 is formed in such a way that a normal vector to the surface is not directed toward the valid pixel region 12. Therefore, for example, light made incident to the valid pixel peripheral region 13 shall be reflected in a direction other than the direction toward the valid pixel region 12.

For example, in an upper side region 16-1 which contacts the upper side of the valid pixel region 12 and extends to left and right sides of the valid pixel peripheral region 13, the slit type light diffraction gratings 14 are each formed in such a way that the longitudinal direction thereof extends vertically. Likewise, in a lower side region 16-2 which contacts the lower side of the valid pixel region 12 and extends to the left and right sides of the valid pixel peripheral region 13, the slit type light diffraction gratings 14 are each formed in such a way that the longitudinal direction thereof extends vertically.

On the other hand, in a left side region 16-3 which contacts a left side of the valid pixel region 12 and extends between the upper side region 16-1 and the lower side region 16-2 of the valid pixel peripheral region 13, the slit type light diffraction gratings 14 are each formed in such a way that the longitudinal direction thereof extends in the left and right direction. Likewise, in a right side region 16-4 which contacts a right side of the valid pixel region 12 and extends between the upper side region 16-1 and the lower side region 16-2 of the valid pixel peripheral region 13, the slit type light diffraction gratings 14 are each formed in such a way that the longitudinal direction thereof extends in the left and right direction.

Here, a formation pitch as an interval between the slit type light diffraction gratings 14 formed adjacent to each other is by no means limited to a specific interval. For example, in a process (a fifth process of FIG. 4 which will be described later) for forming the slit type light diffraction gratings 14, the formation pitch of the slit type light diffraction gratings 14 is limited by an exposure wavelength used by an aligner (semiconductor manufacturing device) which is used in patterning of a positive photoresist. Specifically, the formation pitch of the slit type light diffraction gratings 14 is formed at 0.35 μm or more in the case where i-ray is used for the exposure wavelength, and is formed at 0.24 μm or more in the case where a KrF excimer laser is used for the exposure wavelength.

Figure 2:
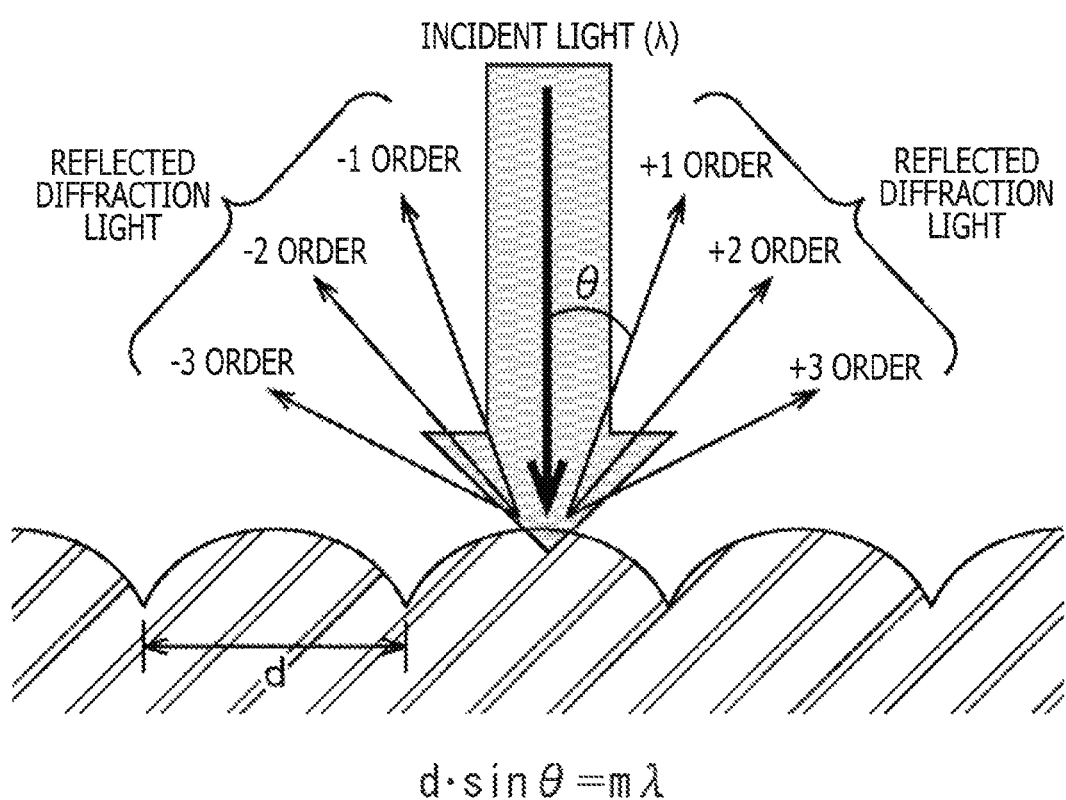
FIG. 2 is a view explaining a relation between a formation pitch of a slit type light diffraction grating and reflected diffraction light.

For example, FIG. 2 depicts reflected diffraction light which is generated in accordance with the formation pitch of the slit type light diffraction gratings 14 when the light made incident to one of the slit type light diffraction gratings 14 is reflected by the slit type light diffraction grating 14. For example, with respect to a relation among the formation pitch d of the slit type light diffraction gratings 14, an incident light wavelength λ, a diffraction angle θ, and a diffraction order m (0, ±1, ±2, ±3, . . . ), an equation depicted in FIG. 2 holds.

In addition, the imaging element 11, as depicted in B of FIG. 1, is configured by laminating a semiconductor substrate 21, a first flattening film 22, a color filter layer 23, a microlens layer 24, and an anti-reflection film 25.

The semiconductor substrate 21, for example, is a wafer obtained by thinly slicing a semiconductor including silicon or the like. A plurality of photodiodes 31 is formed in the semiconductor substrate 21 so as to correspond to the plurality of pixels 17 provided in the valid pixel region 12.

In addition, an inter-pixel light-shielding film 32 and wirings 33 and 34 are deposited on the surface of the semiconductor substrate 21. The inter-pixel light-shielding film 32 is arranged between the pixels 17 in the valid pixel region 12, and performs light-shielding for preventing color mixing between the adjacent pixels 17. The wirings 33 and 34 are used in a peripheral circuit provided in the valid pixel peripheral region 13.

The first flattening film 22 buries stepped portions at end portions of the inter-pixel light-shielding film 32 and the wirings 33 and 34 to flatten the surface.

In the color filter layer 23, a filter 35 transmitting light of a corresponding color is formed for each pixel 17 in the valid pixel region 12 and a light absorbing film 36 is formed in the valid pixel peripheral region 13. For example, for the filter 35 formed for each pixel 17 in the valid pixel region 12, red, green, and blue are used as primary colors, and yellow, cyan, and magenta are used as complementary colors. Then, the pixels 17 each receive the light transmitted through the corresponding filter 35.

In addition, for example, a material obtained by internally adding a black-based pigment including carbon black, a black titanium oxide, an iron oxide (magnetite type triiron tetraoxide), a composite oxide of copper and chromium, a composite oxide of copper, chromium, and zinc, or the like is used for the light absorbing film 36 which is formed over a surface of the valid pixel peripheral region 13. It should be noted that the light absorbing film 36 may use the pigment of at least any one color of the pigments of primary colors such as red, green, and blue, and the pigments of complementary colors such as yellow, cyan, and magenta similarly to the case of the filter 35, and can be formed concurrently with the filter 35 having the color of interest. Alternatively, the light absorbing film 36 may be formed in such a way that the filters 35 having the respective colors are extended to the valid pixel peripheral region 13 in an arrangement similar to that in the valid pixel region 12.

A material having a refractive index of approximately 1.5 to 1.6 is used for the microlens layer 24. Then, a plurality of microlenses 37 for condensing light irradiated to the respective pixels 17 is formed in a corresponding relation with the pixels 17 in the valid pixel region 12 of the microlens layer 24. The microlens 37 is provided for each pixel 17 in this manner, resulting in that an effective area which is effective for reception of light by the pixel 17 can be enlarged and the sensitivity characteristics of the imaging element 11 can be enhanced.

Moreover, the slit type light diffraction gratings 14 as described above are formed in the valid pixel peripheral region 13 of the microlens layer 24.

The anti-reflection film 25 is a film including a material having a lower refractive index than that of the microlens layer 24 and is deposited over the whole surface of the microlenses 37 and the slit type light diffraction gratings 14 in the microlens layer 24. It should be noted that the anti-reflection film 25 has an opening which is opened at a portion at which the bonding pad 16 is provided for bonding the bonding wire to the bonding pad 16.

As described above, in the imaging element 11, a plurality of slit type light diffraction gratings 14 is formed in the valid pixel peripheral region 13 in such a way that the longitudinal direction thereof extends in the direction orthogonal to the side direction of the valid pixel region 12. Therefore, in the imaging element 11, the light made incident to the valid pixel peripheral region 13 shall be reflected toward a direction orthogonal to the longitudinal direction of the plurality of slit type light diffraction gratings 14. Thus, such reflected light as to be directed toward the valid pixel region 12 can be reduced. As a result, in the imaging element 11, a flare, a ghost or the like due to such stray light as to be reflected toward the valid pixel region 12 can be effectively suppressed, and an image having high image quality free from the flare, the ghost or the like can be captured.

<Method of Manufacturing Imaging Element>

A method of manufacturing the imaging element 11 will be described with reference to FIG. 3 to FIG. 5.

Figure 3:
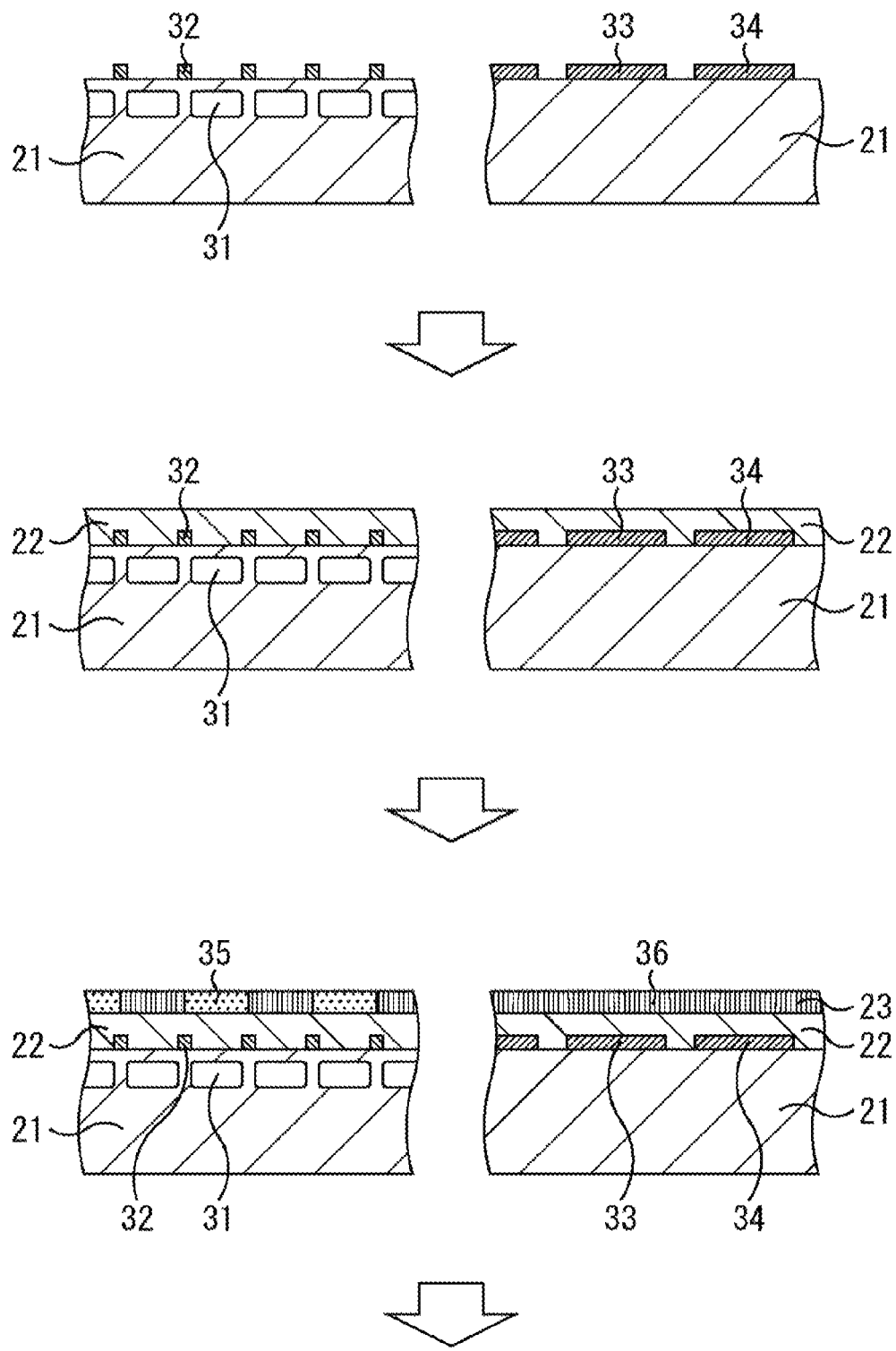
FIG. 3 is a view explaining first to third processes.

First, in a first process, as depicted in an upper stage of FIG. 3, the inter-pixel light-shielding film 32 and the wirings 33 and 34 are formed on the surface of the semiconductor substrate 21 in which the plurality of photodiodes 31 is formed.

In a second process, as depicted in a middle stage of FIG. 3, the first flattening film 22 is deposited so as to bury the stepped portions at the end portions of the inter-pixel light-shielding film 32 and the wirings 33 and 34 on the surface of the semiconductor substrate 21 for flattening. For example, after a material such as an acrylic thermosetting resin is spin-coated, the material is subjected to a heat treatment to be cured, thereby forming the first flattening film 22.

In a third process, as depicted in a lower stage of FIG. 3, the color filter layer 23 is formed so as to be laminated on the first flattening film 22. The color filter layer 23 is formed by the filter 35 of the corresponding color for each photodiode 31 in the valid pixel region 12, and is formed by the light absorbing film 36 including the material to which the pigment such as the black-based colors, the primary colors, or the complementary colors as described above is internally added in the valid pixel peripheral region 13.

Subsequently, in a fourth process, as depicted in an upper stage of FIG. 4, a microlens material film 41 is formed so as to be laminated on the color filter layer 23. For example, after a material such as a polystyrene or acrylic material, or a material including a copolymeric thermosetting resin of these materials is spin-coated, the material is subjected to a heat treatment to be cured, thereby forming the microlens material film 41.

Figure 4:
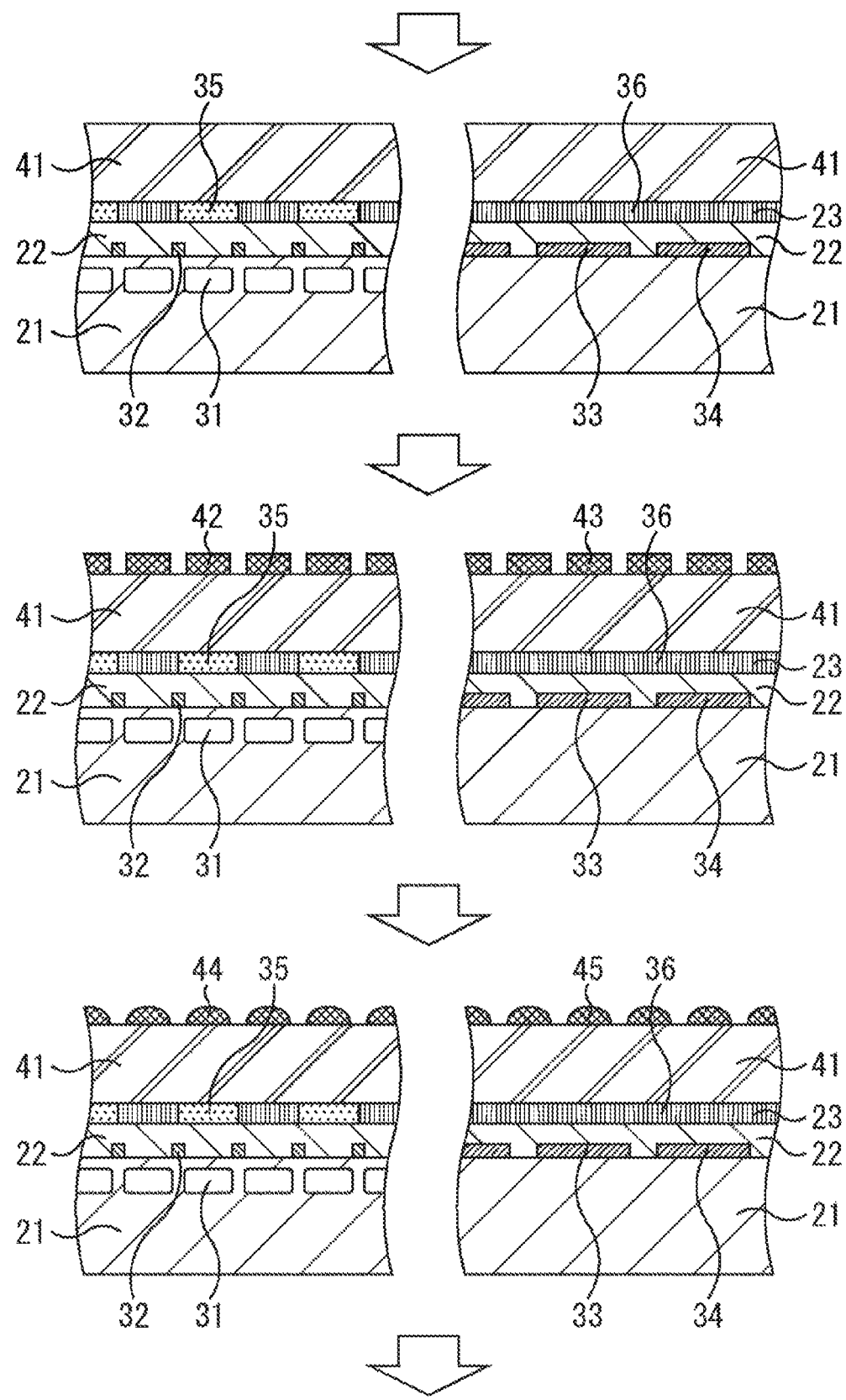
FIG. 4 is a view explaining fourth to sixth processes.

In a fifth process, as depicted in a middle stage of FIG. 4, positive photoresist patterns 42 and 43 are formed so as to be laminated on the microlens material film 41. For example, in the valid pixel region 12, the positive photoresist pattern 42 is formed so as to correspond to portions at which the photodiodes 31 are arranged. On the other hand, in the valid pixel peripheral region 13, the photoresist pattern 43 is formed at intervals in accordance with the formation pitch of the slit type light diffraction gratings 14 with a longitudinal direction thereof following the slit type light diffraction gratings 14. It should be noted that, for example, after a resist material having photosensitivity is spin-coated, the resist is pre-baked and is exposed in accordance with the respective patterns, and then is subjected to a developing process, thereby forming the photoresist patterns 42 and 43.

In a sixth process, as depicted in a lower stage of FIG. 4, a process is performed such that a microlens base material pattern 44 is formed from the photoresist pattern 42, and a slit base material pattern 45 is formed from the photoresist pattern 43. For example, heat reflow by a heat treatment at a temperature equal to or higher than a heat softening point of each of the photoresist patterns 42 and 43 is performed for the photoresist patterns 42 and 43, thereby forming the microlens base material pattern 44 according to the shape of the microlens 37 and the slit base material pattern 45 according to the shape of the slit type light diffraction grating 14.

Subsequently, in a seventh process, as depicted in an upper stage of FIG. 5, in the valid pixel region 12, the microlens 37 is arranged for each pixel 17, and in the valid pixel peripheral region 13, the microlens layer 24 is formed in which the slit type light diffraction gratings 14 are arranged. For example, together with the microlens base material pattern 44 and the slit base material pattern 45, the microlens material film 41 formed as the base of the patterns 44 and 45 is subjected to dry etching processing using gas such as fluorocarbon gas. As a result, the microlens base material pattern 44 is transferred by an etching method such that the effective area of the microlens is enlarged, thereby forming the microlens 37 in the microlens layer 24. At the same time, the slit base material pattern 45 is transferred by the etching method, thereby forming the slit type light diffraction grating 14 in the microlens layer 24.

Figure 5:
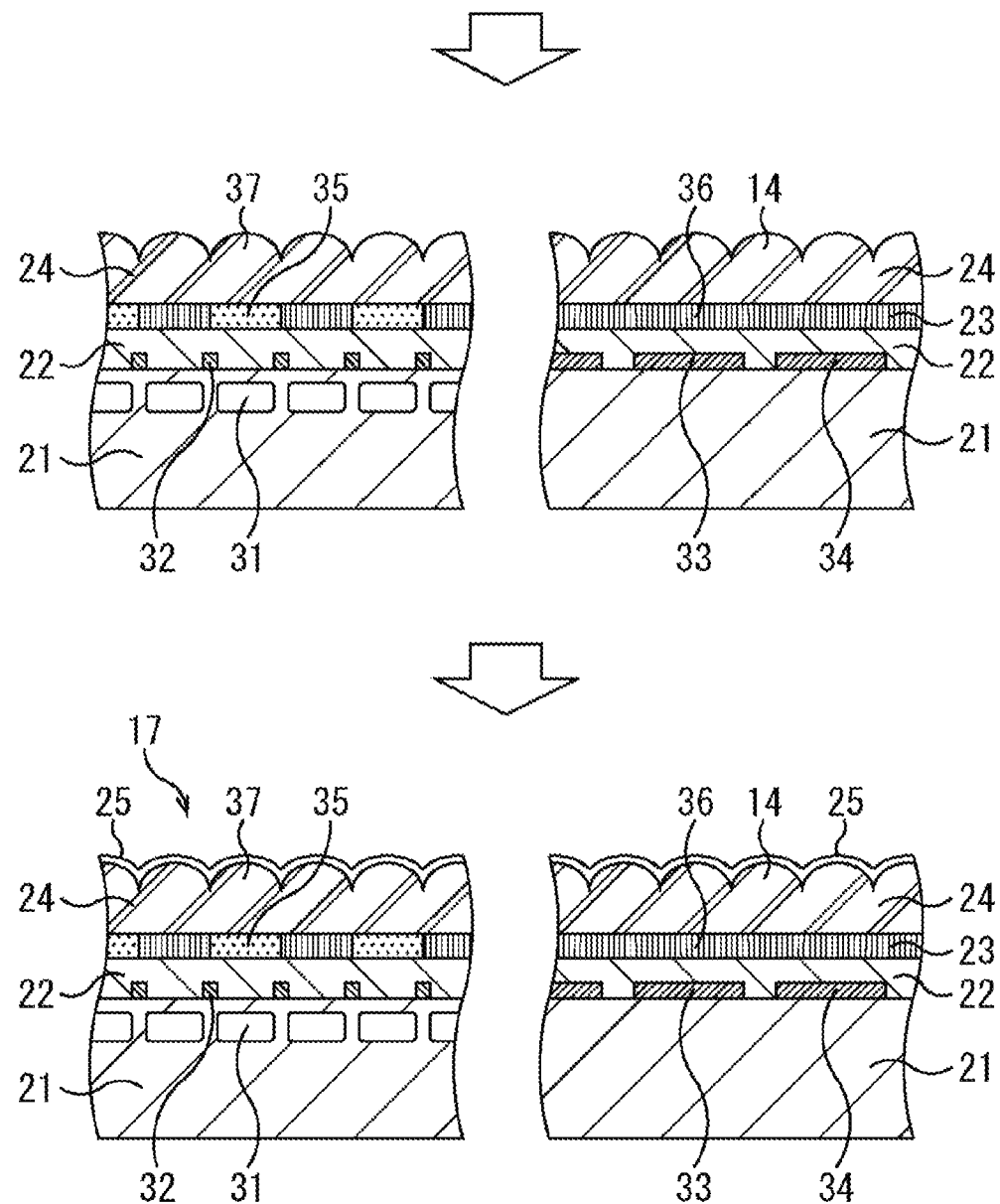
FIG. 5 is a view explaining seventh and eighth processes.

In an eighth process, as depicted in a lower stage of FIG. 5, the anti-reflection film 25 is deposited over the entire surface of the microlens layer 24. A silicon oxide film, for example, having a refractive index of approximately 1.45 is used for the anti-reflection film 25, and heat of approximately 180° C. to 220° C. is used for the deposition of the silicon oxide film in consideration of heat resistance properties of the first flattening film 22, the color filter layer 23, the microlens layer 24, and the like.

By performing the processes as described above, the imaging element 11 can be manufactured. In this case, in the imaging element 11, the plurality of microlenses 37 is formed so as to correspond to the respective pixels 17 in the valid pixel region 12, the plurality of slit type light diffraction gratings 14 is formed in the valid pixel peripheral region 13, and the anti-reflection film 25 is deposited on the microlenses 37 and the slit type light diffraction gratings 14. As a result, as described above, it is possible to manufacture the imaging element 11 having the higher quality in which the light reflected in the valid pixel peripheral region 13 can be prevented from being directed toward the valid pixel region 12 and the generation of a flare, a ghost, or the like can be suppressed.

Here, various image inputting apparatuses each using the imaging element 11 have therein respective optical systems. In this case, the light made incident to the image inputting apparatus is guided to the valid pixel region 12 of the imaging element 11 via an optical path including a lens, a prism, a mirror and the like of the optical system. For this reason, the formation pitch of the slit type light diffraction gratings 14 needs to be adaptively changed depending on the optical systems of the various image inputting apparatuses. Moreover, the slit type light diffraction gratings 14 may be formed at different formation pitches in one imaging element 11.

Figure 6:
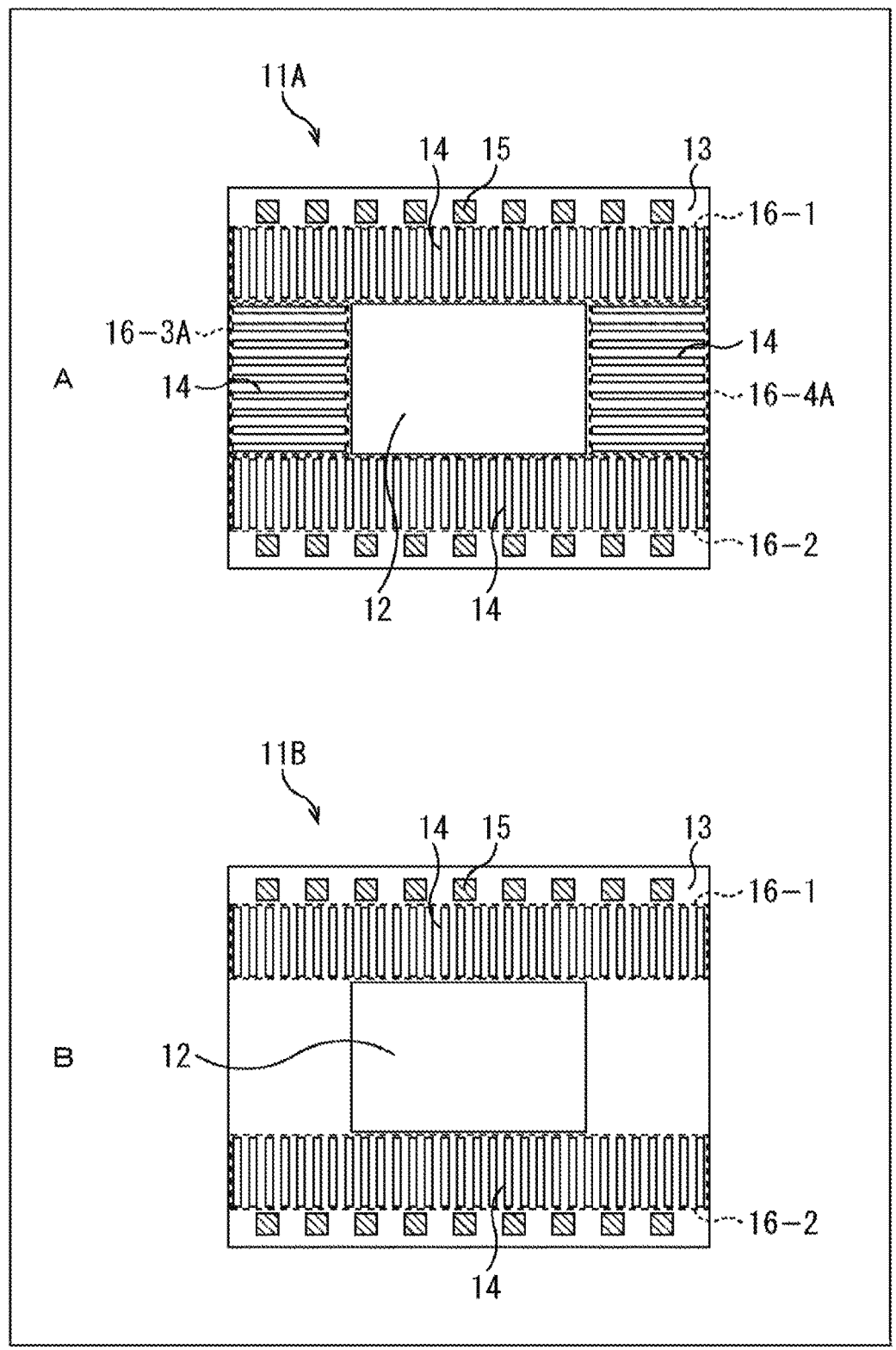
FIG. 6 is a view depicting modified changes of the slit type light diffraction grating.

FIG. 6 depicts modified changes of the slit type light diffraction gratings 14.

For example, in an imaging element 11A depicted in A of FIG. 6, a formation pitch of the slit type light diffraction gratings 14 formed in the upper side region 16-1 and the lower side region 16-2, and a formation pitch of the slit type light diffraction gratings 14 formed in a left side region 16-3A and a right side region 16-4A are different in interval from each other.

In addition, in an imaging element 11B depicted in B of FIG. 6, the slit type light diffraction gratings 14 are formed only in the upper side region 16-1 and the lower side region 16-2. On the other hand, no slit type light diffraction grating 14 is formed in the left side region 16-3 and the right side region 16-4, and thus the left side region 16-3 and the right side region 16-4 are in a flat state.

In this way, in the imaging element 11, the slit type light diffraction gratings 14 which are optimal for suppression of the incidence of the stray light to the valid pixel region 12 can be formed depending on the optical system of the image inputting apparatus to be used.

<Second and Third Configuration Examples of Imaging Element>

Second and third embodiments, of the imaging element, to which the present technology is applied will now be described with reference to FIG. 7. It should be noted that in imaging elements 11C and 11D depicted in FIG. 7, the constituent elements common to those of the imaging element 11 of FIG. 1 are assigned the same reference signs, and a detailed description thereof is omitted.

Figure 7:
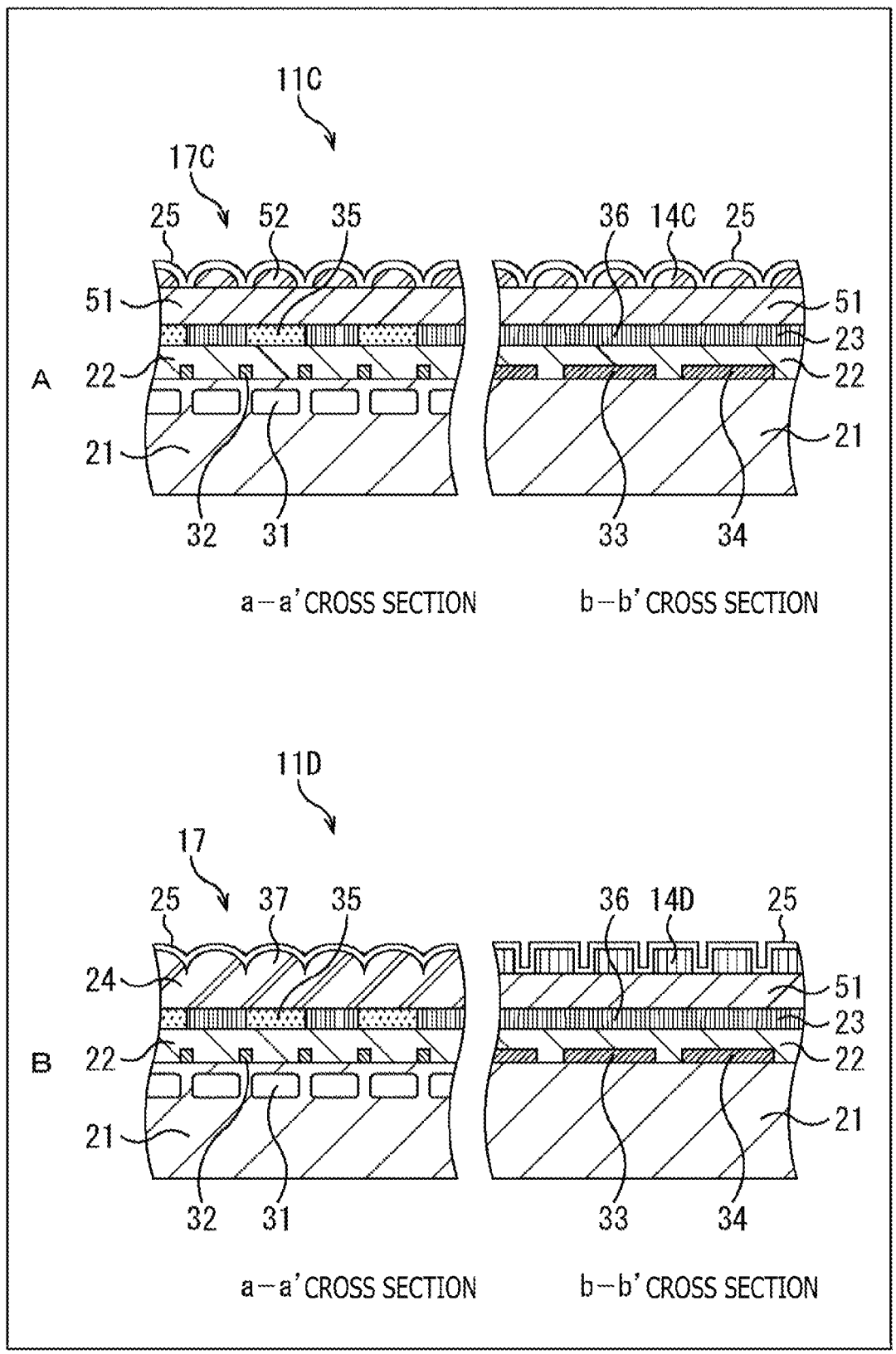
FIG. 7 is a view depicting configuration examples of second and third embodiments of an imaging element.

A of FIG. 7 depicts a cross section taken along line a-a' and a cross section taken along line b-b' in the imaging element 11C similarly to the case of B of FIG. 1.

For example, in the image element 11 of FIG. 1, as described above, the microlenses 37 and the slit type light diffraction gratings 14 are formed by using the dry etching method. On the other hand, the configuration of the imaging element 11C is different from the configuration of the imaging element 11 in that microlenses 52 and slit type light diffraction gratings 14C are formed by using heat reflow (heat melt reflow) method.

That is, in the imaging element 11C, the semiconductor substrate 21, the first flattening film 22, the color filter layer 23, and the anti-reflection film 25 are configured similarly to the case of the imaging element 11 of FIG. 1. On the other hand, the configuration of the imaging element 11C is different from the configuration of the imaging element 11 of FIG. 1 in that a second flattening film 51 is deposited on the color filter layer 23, and the microlenses 52 and the slit type light diffraction gratings 14C are formed so as to be laminated on the second flattening film 51.

For example, after bleaching exposure is performed for positive photosensitive resins each of which is formed into a pattern by performing exposure and development process by utilizing a known photolithography method to attenuate light absorption of a visible light short wavelength region of a photosensitive material in the photosensitive resins, the heat reflow is performed to form the microlenses 52 and the slit type light diffraction gratings 14C. Thereafter, the anti-reflection film 25 having a lower refractive index than those of the positive photosensitive resins is deposited. Here, in the photosensitive material in the positive photosensitive resins, light absorption occurs on a short wavelength side of the visible light region. Thus, before the heat reflow is performed, ultraviolet exposure is performed to decompose the photosensitive material to attenuate the light absorption, thereby enabling the higher image quality to be achieved. For example, a material such as a polystyrene or acrylic material, or a material including a copolymeric thermosetting resin of these materials can be used for the microlenses 52 and the slit type light diffraction gratings 14C. In this case, the refractive index of the microlenses 52 and the refractive index of the slit type light diffraction gratings 14C are approximately 1.5 to 1.6, and a silicon oxide film having the refractive index of approximately 1.45 is used for the anti-reflection film 25.

B of FIG. 7 depicts a cross section taken along line a-a' and a cross section taken along line b-b' in an imaging element 11D similarly to the case of B of FIG. 1.

In the imaging element 11D depicted in B of FIG. 7, the semiconductor substrate 21, the first flattening film 22, the color filter layer 23, and the anti-reflection film 25 are configured similarly to the case of the imaging element 11 of FIG. 1. In addition, the imaging element 11D is similar to the imaging element 11 of FIG. 1 also in that the microlenses 37 are formed in the microlens layer 24 in the valid pixel region 12.

On the other hand, the configuration of the imaging element 11D is different from the configuration of the imaging element 11 of FIG. 1 in that, in the valid pixel peripheral region 13, slit type light diffraction gratings 14D formed so as to be laminated on the second flattening film 51 include a material different from the material of the microlens layer 24.

For example, a material obtained by internally adding a black-based pigment including carbon black, a black titanium oxide, an iron oxide (magnetite type triiron tetraoxide), a composite oxide of copper and chromium, a composite oxide of copper, chromium, and zinc, or the like can be used for the slit type light diffraction gratings 14D. The material having a light absorption property is used for the slit type light diffraction gratings 14D in this manner, resulting in that a quantity of stray light entering the inside of the valid pixel peripheral region 13 can be reduced, and accordingly the reflected light from a peripheral circuit, a wiring metal (the wirings 33 and 34) and the like shall be reduced.

Therefore, in the imaging element 11D, along with the reduction of the reflected light in the valid pixel peripheral region 13, re-reflected light from the electronic apparatus optical system can be reduced. Thus, a flare or a ghost which is generated due to the incidence of the re-reflected light to the valid pixel region 12 shall be reduced. As a result, the deterioration of the image quality of the imaging element 11D can be suppressed.

<Configuration Example of Imaging Device Utilizing Photolysis Prism>

Figure 8:
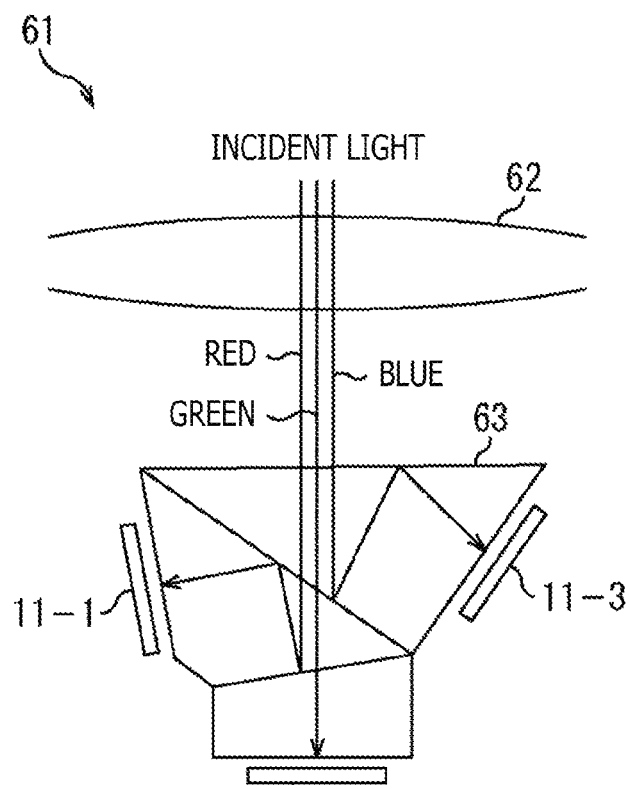
FIG. 8 is a view depicting a configuration example of an imaging device utilizing a photolysis prism.

FIG. 8 depicts a schematic configuration example of an imaging device utilizing a photolysis prism.

As depicted in FIG. 8, an imaging device 61 includes an objective 62, a photolysis prism 63, and imaging elements 11-1 to 11-3.

The objective 62 condenses incident light made incident to the imaging device 61 to form an image of a subject on light receiving surfaces of the imaging elements 11-1 to 11-3.

The photolysis prism 63 is configured so as to transmit only light of a specific wavelength range and reflect light other than the light of the specific wavelength range, and, for example, splits the incident light into red light, green light, and blue light. For example, the photolysis prism 63 transmits light of a green wavelength range to cause the light to be received by the imaging element 11-2, reflects light of a red wavelength range to cause the light to be received by the imaging element 11-1, and reflects light of a blue wavelength range to cause the light to be received by the imaging element 11-3. It should be noted that each of the imaging elements 11-1 to 11-3 is not provided with the filter 35 for each pixel 17 as described above, and all the pixels 17 receive the light of the corresponding wavelength ranges.

In the imaging device 61 configured in this manner, in the case where in the valid pixel peripheral region 13 of each of the imaging elements 11-1 to 11-3, light is reflected toward the valid pixel region 12, it is assumed that the light of interest is re-reflected within the photolysis prism 63 and made incident as stray light to the valid pixel region 12 of the imaging element 11. Heretofore, such stray light turns into a flare, a ghost, or the like to cause deterioration of the image quality.

On the other hand, the imaging elements 11-1 to 11-3 have the configuration in which in the valid pixel peripheral region 13, the reflection of such light as to be directed toward the valid pixel region 12 is suppressed. Therefore, it is avoided that the stray light via the photolysis prism 63 is made incident to the valid pixel region 12. As a result, the imaging elements 11-1 to 11-3 can capture an image having high image quality free from a flare, a ghost or the like.

<Configuration Example of Imaging Device>

It should be noted that the imaging element 11 as described above, for example, can be applied to various kinds of electronic apparatuses such as an imaging system such as a digital still camera or a digital video camera, a mobile phone including an imaging function, or other apparatuses including an imaging function.

Figure 9:
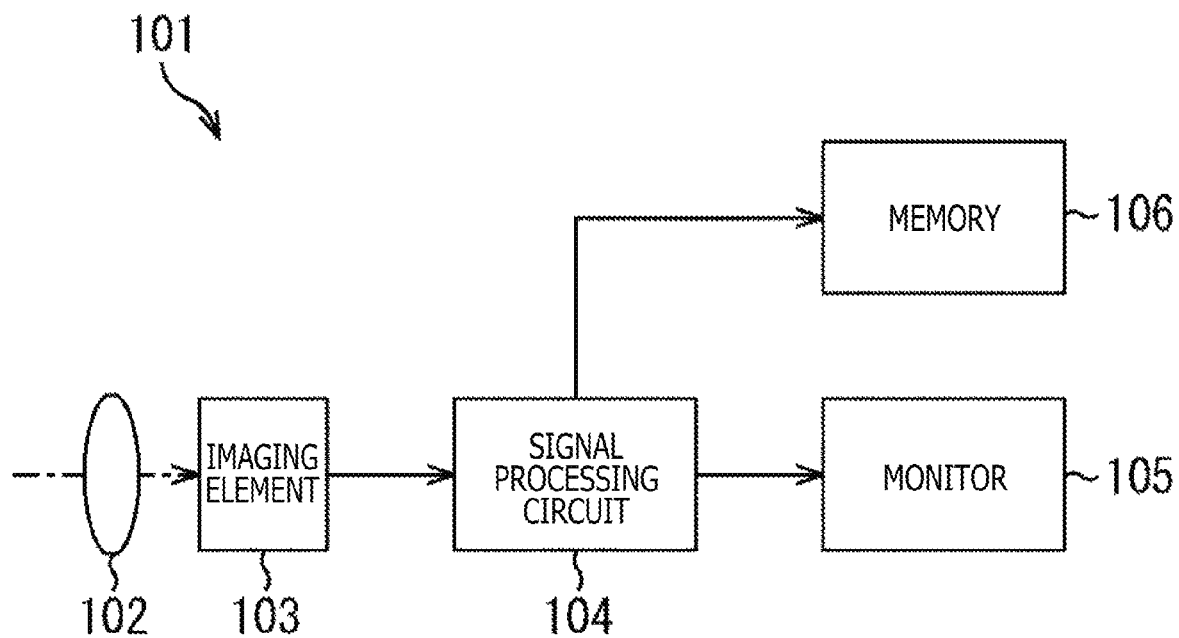
FIG. 9 is a block diagram depicting a configuration example of the imaging device.

FIG. 9 is a block diagram depicting a configuration example of an imaging device mounted to an electronic apparatus.

As depicted in FIG. 9, an imaging device 101 includes an optical system 102, an imaging element 103, a signal processing circuit 104, a monitor 105, and a memory 106, and can capture still images and moving images.

The optical system 102 includes one or a plurality of lenses, and guides image light (incident light) from a subject to the imaging element 103 to cause image formation on a light receiving surface (sensor part) of the imaging element 103.

The imaging element 11 described above is applied as the imaging element 103. Electrons are accumulated in the imaging element 103 for a given period of time in accordance with an image formed on the light receiving surface via the optical system 102. Then, a signal according to the electrons accumulated in the imaging element 103 is supplied to the signal processing circuit 104.

The signal processing circuit 104 executes various kinds of signal processing for a pixel signal outputted from the imaging element 103. An image (image data) obtained by the signal processing circuit 104 executing the signal processing is supplied to the monitor 105 to be displayed, or supplied to the memory 106 to be stored (recorded).

In the imaging device 101 configured in this manner, the imaging element 11 as described above is applied, thereby, for example, enabling an image having higher image quality to be captured.

<Use Examples of Image Sensor>

Figure 10:
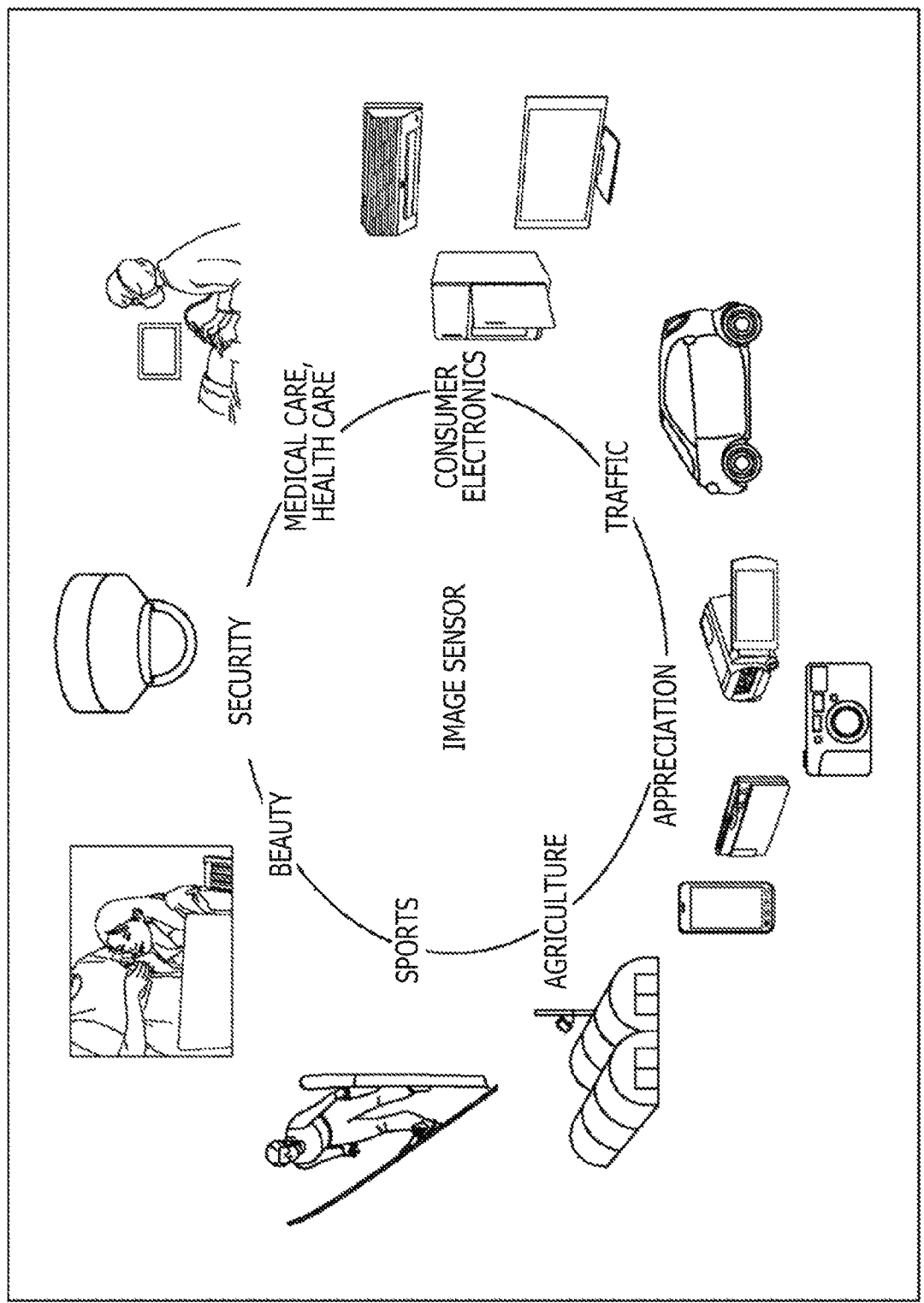
FIG. 10 is a view depicting examples of use in which an image sensor is used.

FIG. 10 is a view depicting examples of use in which the image sensor described above is used.

The image sensor described above, for example, as will be described below, can be used in various cases of sensing light such as visible light, infrared light, ultraviolet light, and X-rays.

- A device, which captures an image for use in appreciation, such as a digital camera or a portable apparatus with a camera function.
- A device, for use in traffic, such as a vehicle-mounted sensor which photographs a front side, a rear side, a periphery, an inside or the like of an automobile for safe driving in automatic stop or the like, recognition of a state of a driver, or the like, a monitoring camera which monitors a travelling vehicle and a road, or a distance measuring sensor which measures a distance between vehicles
- A device, for use in consumer electronics such as a TV, a refrigerator, or an air conditioner, which images a gesture of a user to perform an apparatus operation according to the gesture
- A device, for use in medical care or health care, such as an endoscope, or a device which photographs a blood vessel by receiving infrared light
- A device, for use in security, such as a monitoring camera for security applications, or a camera for person authentication applications
- A device, for use in beauty, such as a skin measuring instrument which photographs a skin, or a microscope which photographs a scalp
- A device, for use in sport, such as an action camera or a wearable camera for sport applications
- A device, for use in agriculture, such as a camera which monitors a state of a field or crops <Example of Application to Endoscopic Surgery System>

The technology according to the present disclosure (present technology) can be applied to various products. For example, the technology according to the present disclosure may be applied to an endoscopic surgery system.

Figure 11:
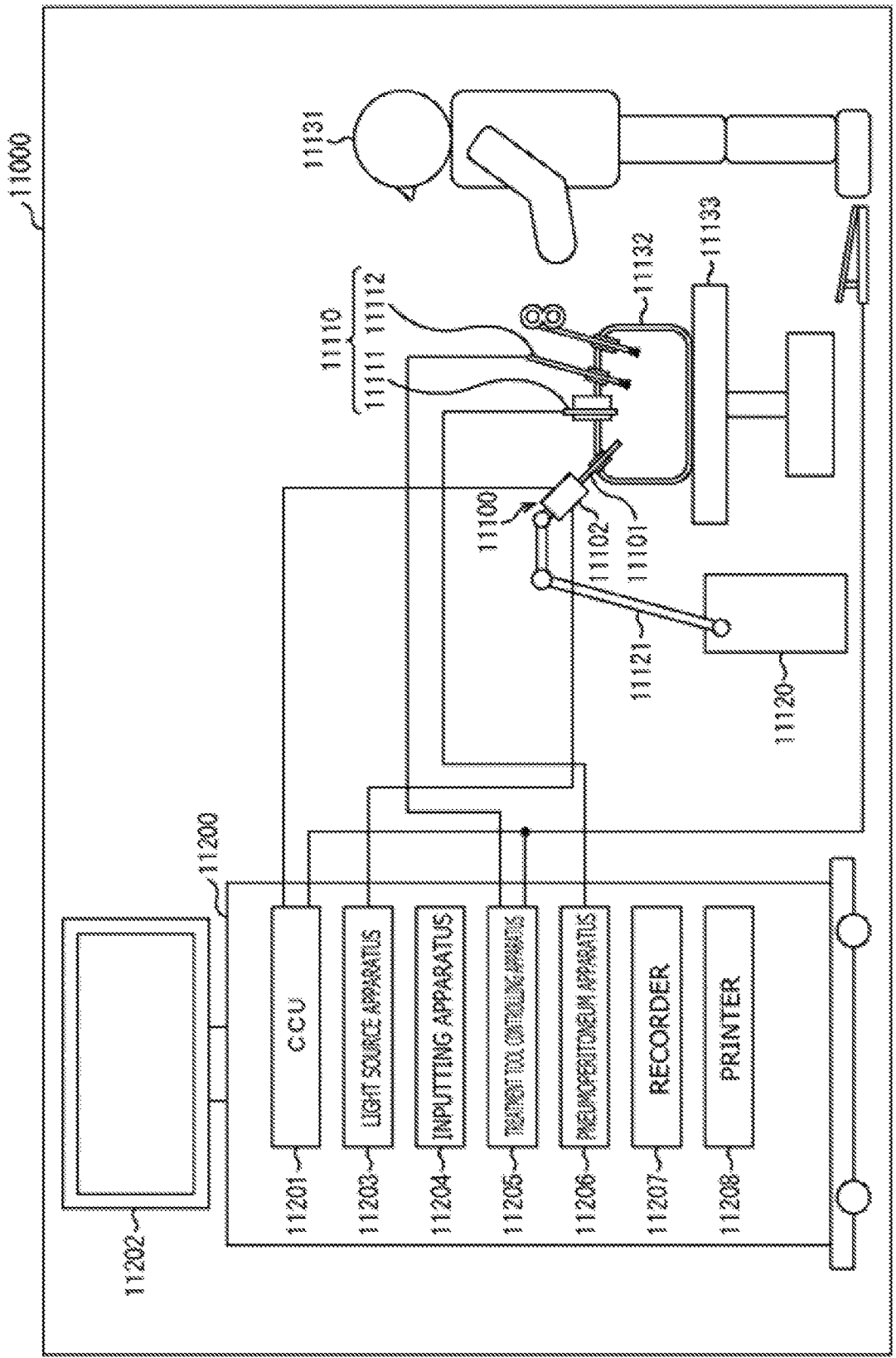
FIG. 11 is a view depicting an example of a schematic configuration of an endoscopic surgery system.

FIG. 11 is a view depicting an example of a schematic configuration of an endoscopic surgery system to which the technology according to an embodiment of the present disclosure (present technology) can be applied.

In FIG. 11, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photoelectrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 12:
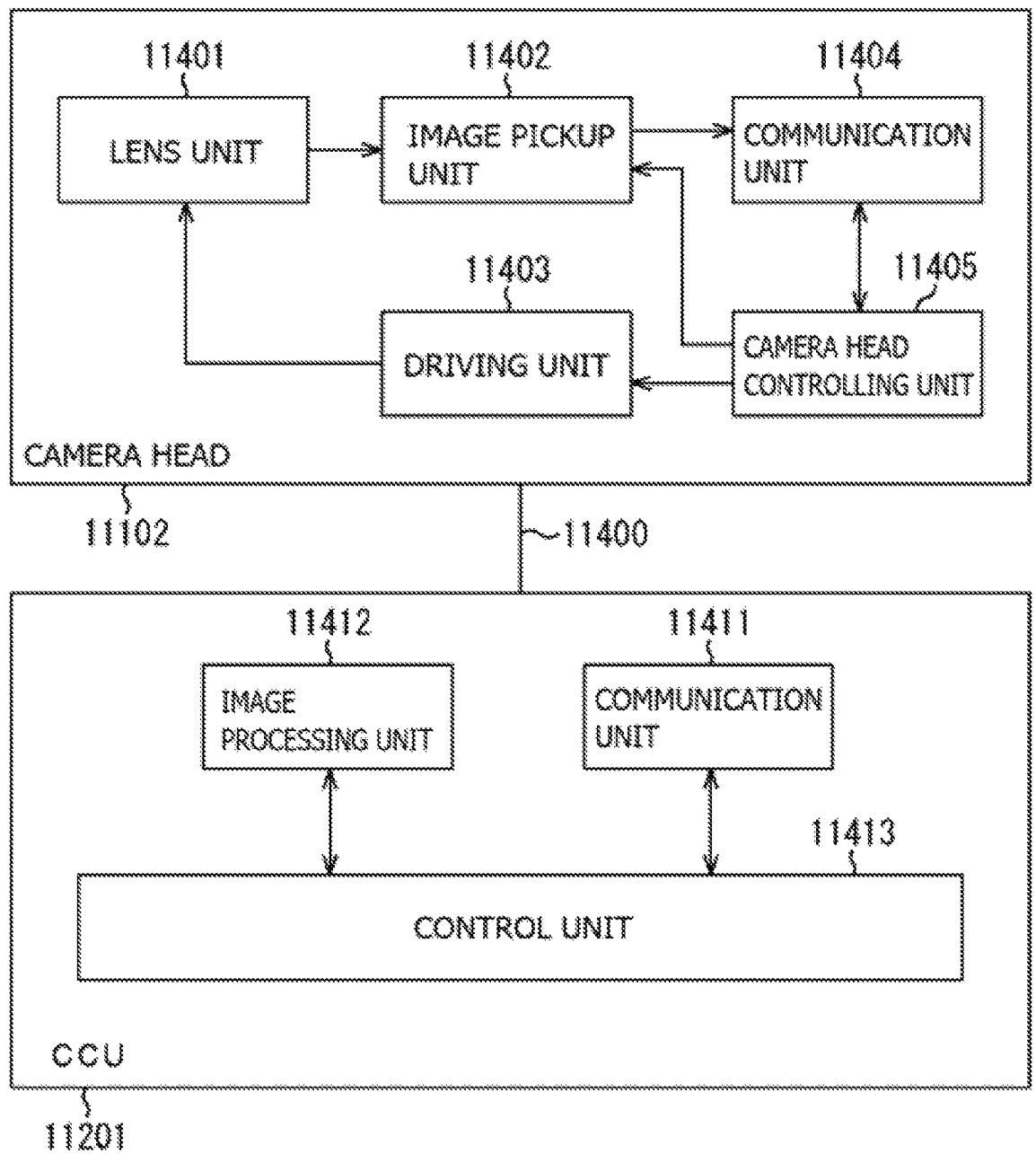
FIG. 12 is a block diagram depicting an example of a functional configuration of a camera head and a camera control unit (CCU).

FIG. 12 is a block diagram depicting an example of a functional configuration of the camera head 11102 and the CCU 11201 depicted in FIG. 11.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

The example of the endoscopic surgery system to which the technology according to the present disclosure can be applied has been described so far. The technology according to the present disclosure can be applied to the endoscope 11100, (the image pickup unit 11402 of) the camera head 11102, (the image processing unit 11412 of) the CCU 11201, and the like among the constituent elements described above. Specifically, for example, the imaging element 11 of FIG. 1 can be applied to the image pickup unit 11402. Since the technology according to the present disclosure is applied to the image pickup unit 11402, resulting in that an image of a surgical region having higher image quality can be obtained, the surgeon can reliably confirm the surgical region.

<Example of Application to In-Vivo Information Acquisition System>

The technology according to the present disclosure (present technology) can be applied to various products. For example, the technology according to the present disclosure may be applied to an endoscopic surgery system.

Figure 13:
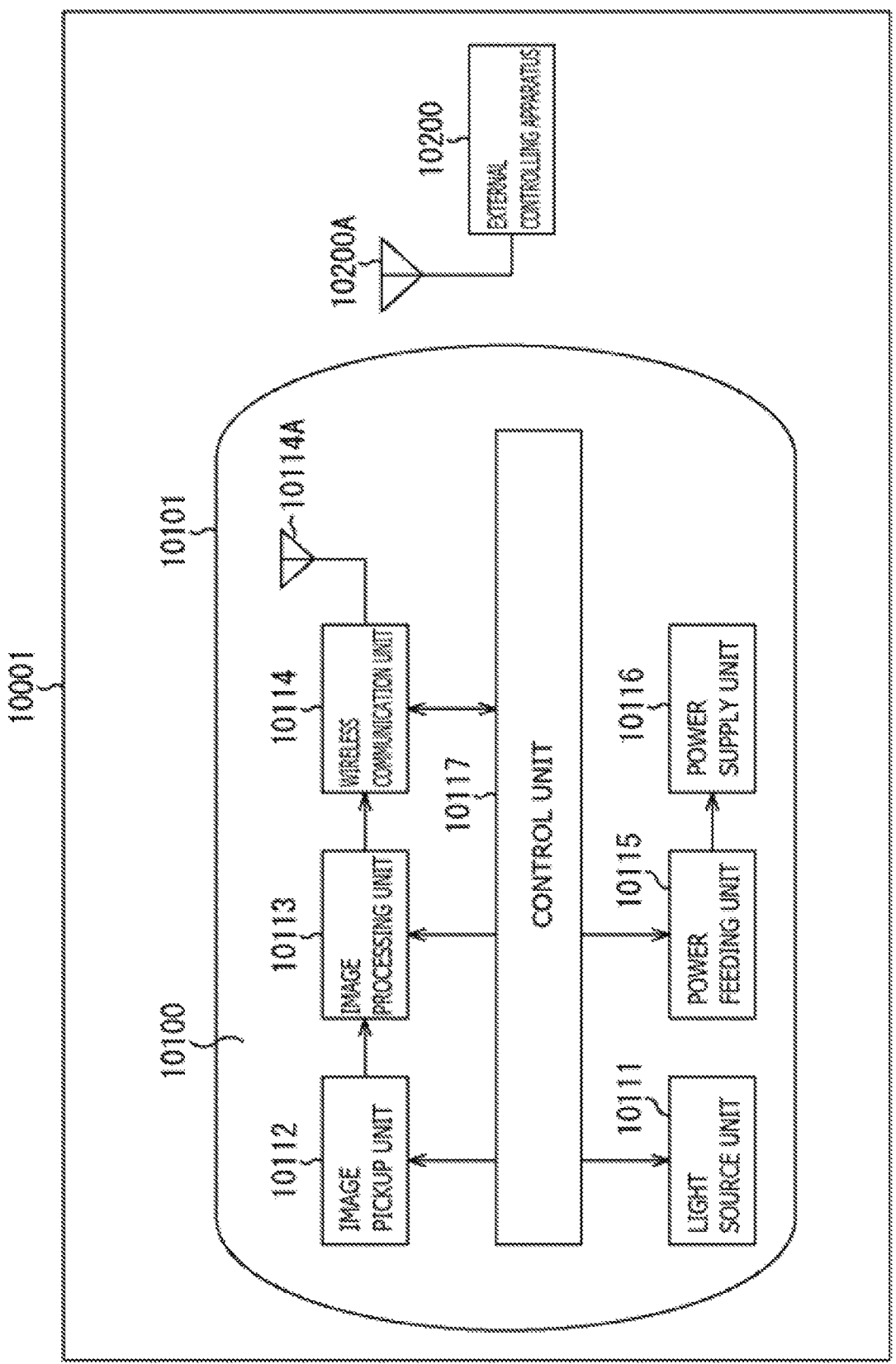
FIG. 13 is a block diagram depicting an example of a schematic configuration of an in-vivo information acquisition system.

FIG. 13 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 13, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

The example of the in-vivo information acquisition system to which the technology according to the present disclosure can be applied has been described so far. The technology according to the present disclosure can be applied to the image pickup unit 10112 among the constituent elements described above. Specifically, for example, the imaging element 11 of FIG. 1 can be applied to the image pickup unit 10112. Since the technology according to the present disclosure is applied to the image pickup unit 10112, resulting in that an image of a surgical region having higher image quality can be obtained, the accuracy of the inspection can be enhanced.

<Example of Application to Mobile Body>

The technology according to the present disclosure (present technology) can be applied to various products. For example, the technology according to the present disclosure may also be realized as a device mounted to any kind of mobile body such as an automobile, an electric automobile, a hybrid electric automobile, a motorcycle, a bicycle, a personal mobility, an airplane, a drone, a ship, or a robot.

Figure 14:
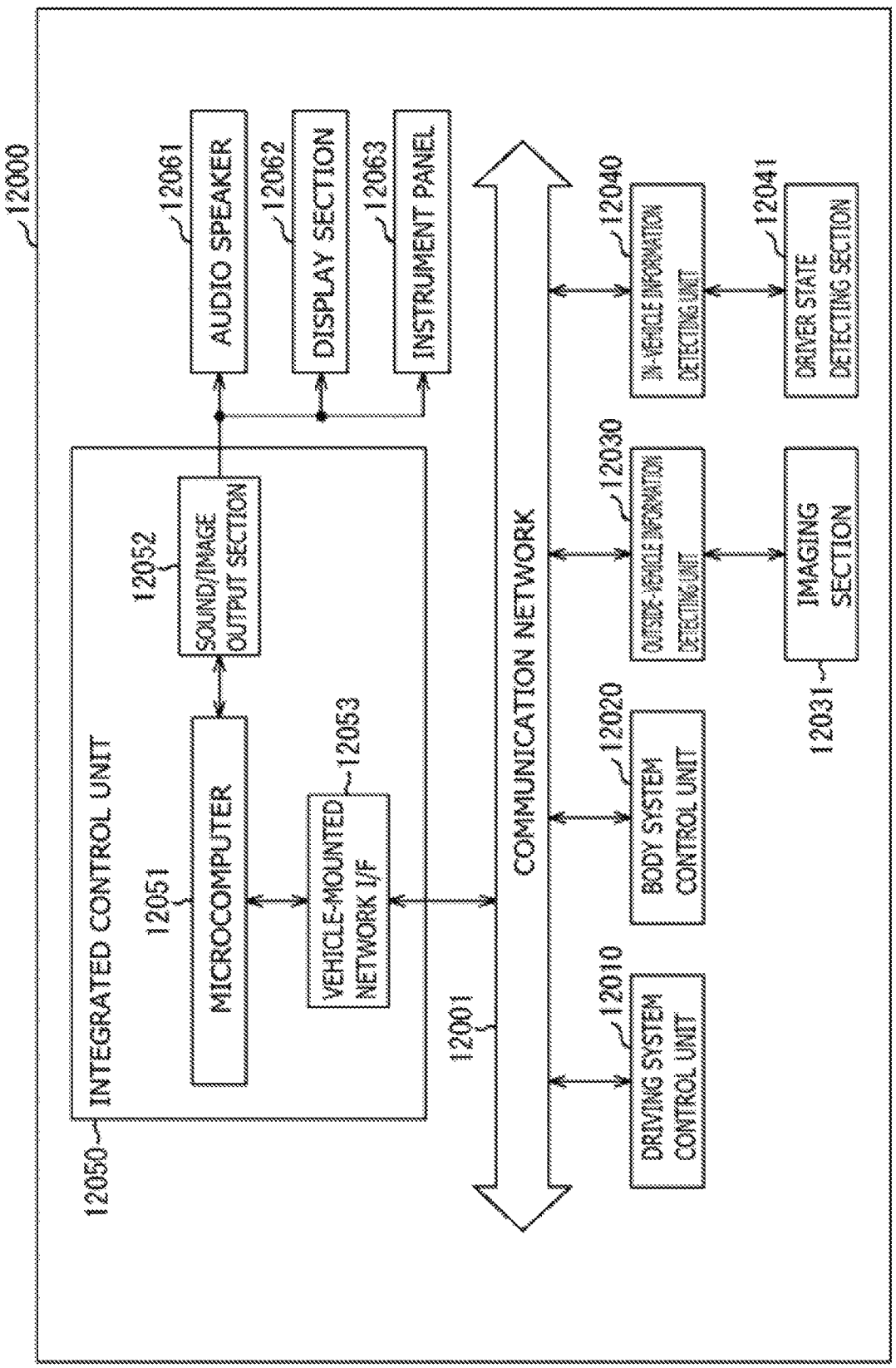
FIG. 14 is a block diagram depicting an example of schematic configuration of a vehicle control system.

FIG. 14 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 14, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 14, an audio speaker 12061, a display section 12062, and an instrument panel 12063 are illustrated as the output device. The display section 12062 may, for example, include at least one of an on-board display and a head-up display.

Figure 15:
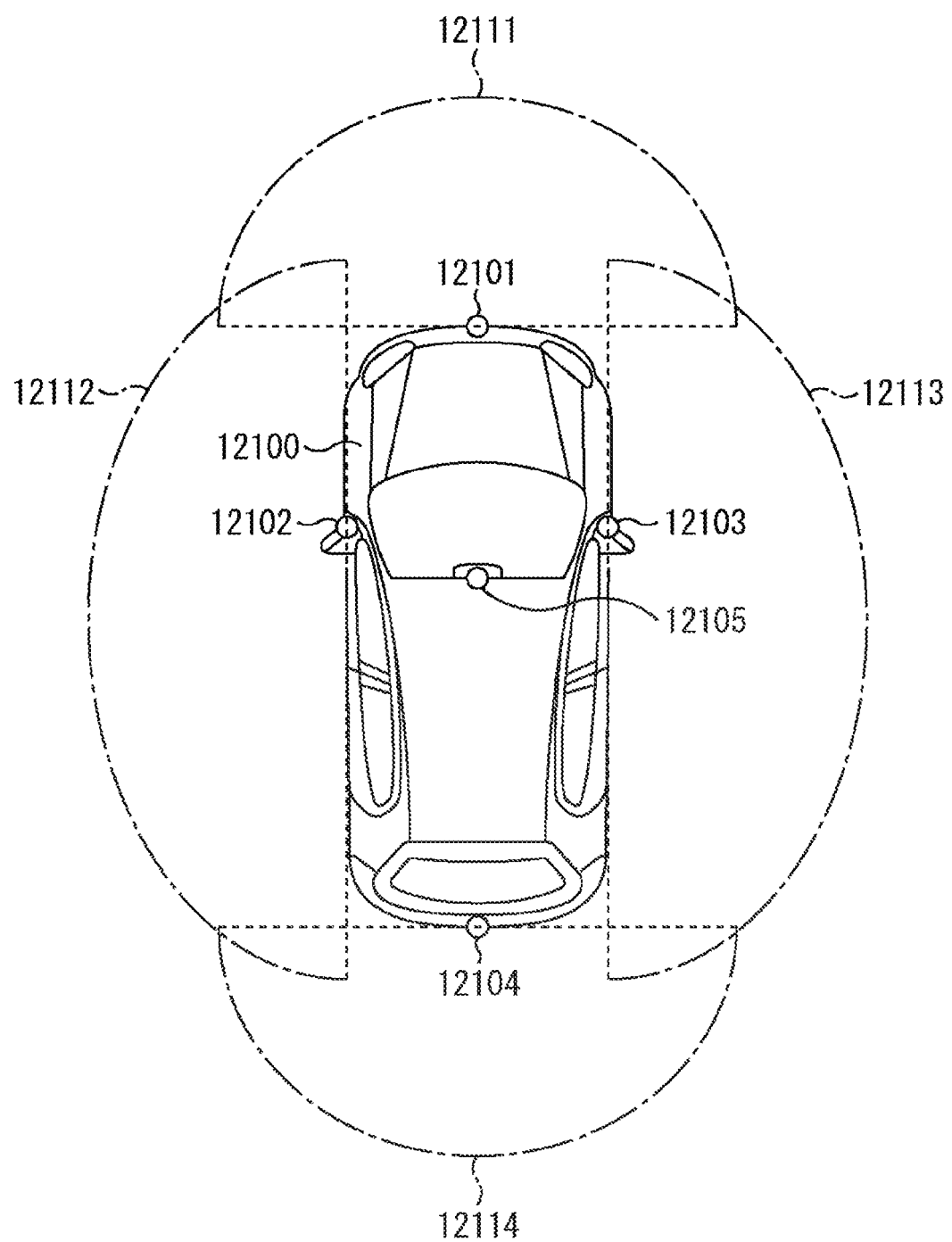
FIG. 15 is a diagram of assistance in explaining an example of installation positions of an outside-vehicle information detecting section and an imaging section.

FIG. 15 is a diagram depicting an example of the installation position of the imaging section 12031.

In FIG. 15, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 15 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The example of the vehicle control system to which the technology according to the present disclosure can be applied has been described so far. The technology according to the present disclosure, for example, can be applied to the imaging section 12031 or the like among the constituent elements described above. Specifically, for example, the imaging element 11 of FIG. 1 can be applied to the imaging section 12031. The technology according to the present disclosure is applied to the imaging section 12031, resulting in that, for example, the outside-vehicle information can be acquired with higher image quality, and the enhancement of the safety of the automatic driving or the like can be realized.

<Examples of Combination of Configurations>

It should be noted that the present technology can also adopt the following configurations.

(1)

An imaging element, including:

a valid pixel region in which a plurality of pixels is arranged in a matrix and a plurality of microlenses for condensing light is formed in a corresponding relation with the pixels; and a valid pixel peripheral region which is provided so as to surround an outside of the valid pixel region, and in which a plurality of slit type light diffraction gratings is formed such that a longitudinal direction thereof extends in a direction orthogonal to a side direction of the valid pixel region.

(2)

The imaging element according to (1) described above, in which an anti-reflection film is deposited on the slit type light diffraction gratings and the microlenses.

(3)

The imaging element according to (1) or (2) described above, in which the slit type light diffraction gratings in the valid pixel peripheral region are formed in a same process as a process for forming the microlenses in the valid pixel region.

(4)

The imaging element according to any one of (1) to (3) described above, in which the slit type light diffraction gratings in the valid pixel peripheral region and the microlenses in the valid pixel region are formed by using an etching method.

(5)

The imaging element according to any one of (1) to (3) described above, in which the slit type light diffraction gratings in the valid pixel peripheral region and the microlenses in the valid pixel region are formed by using a heat reflow method.

(6)

The imaging element according to any one of (1) to (5) described above, in which the slit type light diffraction gratings in the valid pixel peripheral region include a material different from a material of the microlenses in the valid pixel region.

(7)

A manufacturing method including the steps of:

forming a plurality of microlenses for condensing light, in a valid pixel region in which a plurality of pixels is arranged in a matrix, in a corresponding relation with the pixels; and forming a plurality of slit type light diffraction gratings in a valid pixel peripheral region provided so as to surround an outside of the valid pixel region such that a longitudinal direction thereof extends in a direction orthogonal to a side direction of the valid pixel region.

(8)

An electronic apparatus including:

an imaging element including a valid pixel region in which a plurality of pixels is arranged in a matrix and a plurality of microlenses for condensing light is formed in a corresponding relation with the pixels, and a valid pixel peripheral region which is provided so as to surround an outside of the valid pixel region, and in which a plurality of slit type light diffraction gratings is formed such that a longitudinal direction thereof extends in a direction orthogonal to a side direction of the valid pixel region.

It should be noted that the embodiments are by no means limited to the embodiments described above, and various changes can be made without departing from the subject matter of the present disclosure.

REFERENCE SIGNS LIST

11 . . . Imaging element, 12 . . . Valid pixel region, 13 . . . Valid pixel peripheral region, 14 . . . Slit type light diffraction grating, 15 . . . Bonding pad, 16-1 . . . Upper side region, 16-2 . . . Lower side region, 16-3 . . . Left side region, 16-4 . . . Right side region, 17 . . . Pixel, 21 . . . Semiconductor substrate, 22 . . . First flattening film, 23 . . . Color filter layer, 24 . . . Microlens layer, 25 . . . Anti-reflection film, 31 . . . Photodiode, 32 . . . Inter-pixel light-shielding film, 33 and 34 . . . Wiring, 35 . . . Filter, 36 . . . Light absorbing film, 37 . . . Microlens

What is claimed is:

1. An imaging element, comprising:

a valid pixel region in which a plurality of pixels is arranged in a matrix and a plurality of microlenses for condensing light is formed in a corresponding relation with the pixels; and a valid pixel peripheral region which is provided so as to surround an outside of the valid pixel region, and in which a plurality of slit type light diffraction gratings is formed such that a longitudinal direction thereof extends in a direction orthogonal to a side direction of the valid pixel region, wherein the plurality of slit type light diffraction gratings is provided at different intervals around the valid pixel peripheral region, and wherein the plurality of slit type light diffraction gratings provided on an upper side and a lower side of the valid pixel peripheral region are formed at different intervals than the plurality of slit type light diffraction gratings provided on a left and a right side of the valid pixel peripheral region.

2. The imaging element according to claim 1, wherein an anti-reflection film is deposited on the slit type light diffraction gratings and the microlenses.

3. The imaging element according to claim 1, wherein the slit type light diffraction gratings in the valid pixel peripheral region are formed in a same process as a process for forming the microlenses in the valid pixel region.

4. The imaging element according to claim 1, wherein the slit type light diffraction gratings in the valid pixel peripheral region and the microlenses in the valid pixel region are formed by using an etching method.

5. The imaging element according to claim 1, wherein the slit type light diffraction gratings in the valid pixel peripheral region and the microlenses in the valid pixel region are formed by using a heat reflow method.

6. The imaging element according to claim 1, wherein the slit type light diffraction gratings in the valid pixel peripheral region include a material different from a material of the microlenses in the valid pixel region.

7. A manufacturing method including the steps of:
forming a plurality of microlenses for condensing light, in a valid pixel region in which a plurality of pixels is arranged in a matrix, in a corresponding relation with the pixels; and
forming a plurality of slit type light diffraction gratings in a valid pixel peripheral region provided so as to surround an outside of the valid pixel region such that a longitudinal direction thereof extends in a direction orthogonal to a side direction of the valid pixel region,
wherein the plurality of slit type light diffraction gratings is provided at different intervals around the valid pixel peripheral region, and
wherein the plurality of slit type light diffraction gratings provided on an upper side and a lower side of the valid pixel peripheral region are formed at different intervals than the plurality of slit type light diffraction gratings provided on a left and a right side of the valid pixel peripheral region.

8. An electronic apparatus, comprising:
an imaging element including
a valid pixel region in which a plurality of pixels is arranged in a matrix and a plurality of microlenses for condensing light is formed in a corresponding relation with the pixels, and
a valid pixel peripheral region which is provided so as to surround an outside of the valid pixel region, and in which a plurality of slit type light diffraction gratings is formed such that a longitudinal direction thereof extends in a direction orthogonal to a side direction of the valid pixel region,
wherein the plurality of slit type light diffraction gratings is provided at different intervals around the valid pixel peripheral region, and
wherein the plurality of slit type light diffraction gratings provided on an upper side and a lower side of the valid pixel peripheral region are formed at different intervals than the plurality of slit type light diffraction gratings provided on a left and a right side of the valid pixel peripheral region.

9. The manufacturing method according to claim 7, further comprising the step of depositing an anti-reflection film on the slit type light diffraction gratings and the microlenses.

10. The manufacturing method according to claim 7, further comprising the step of forming the slit type light diffraction gratings in the valid pixel peripheral region in a same process as a process for forming the microlenses in the valid pixel region.

11. The manufacturing method according to claim 7, further comprising the step of forming the slit type light diffraction gratings in the valid pixel peripheral region and the microlenses in the valid pixel region using an etching method.

12. The manufacturing method according to claim 7, further comprising the step of forming the slit type light diffraction gratings in the valid pixel peripheral region and the microlenses in the valid pixel region using a heat reflow method.

13. The manufacturing method according to claim 7, wherein the slit type light diffraction gratings in the valid pixel peripheral region include a material different from a material of the microlenses in the valid pixel region.

14. The electronic apparatus according to claim 8, wherein an anti-reflection film is deposited on the slit type light diffraction gratings and the microlenses.

15. The electronic apparatus according to claim 8, wherein the slit type light diffraction gratings in the valid pixel peripheral region are formed in a same process as a process for forming the microlenses in the valid pixel region.

16. The electronic apparatus according to claim 8, wherein the slit type light diffraction gratings in the valid pixel peripheral region and the microlenses in the valid pixel region are formed by using an etching method.

17. The electronic apparatus according to claim 8, wherein the slit type light diffraction gratings in the valid pixel peripheral region and the microlenses in the valid pixel region are formed by using a heat reflow method.

18. The electronic apparatus according to claim 8, wherein the slit type light diffraction gratings in the valid pixel peripheral region include a material different from a material of the microlenses in the valid pixel region.

* * * * *